United States Patent [19]
McCollum et al.

[11] Patent Number: 6,028,460
[45] Date of Patent: Feb. 22, 2000

[54] HYBRID ANALOG-DIGITAL PHASE LOCK LOOP MULTI-FREQUENCY SYNTHESIZER

[75] Inventors: Robert L. McCollum, Chandler; James W. Taylor, Tempe, both of Ariz.

[73] Assignee: Comtech Communications Corp., Tempe, Ark.

[21] Appl. No.: 09/093,494

[22] Filed: Jun. 8, 1998

[51] Int. Cl.$^7$ .................................................. H03L 7/087
[52] U.S. Cl. ........................... 327/105; 327/156; 327/159; 331/11
[58] Field of Search .................................... 327/156, 105, 327/141, 159, 147, 99; 331/11, 14

[56] References Cited

U.S. PATENT DOCUMENTS

5,739,727   4/1998   Lofter et al. ................................ 331/11

*Primary Examiner*—Dinh T. Le
*Attorney, Agent, or Firm*—Harry M. Weiss; Jeffrey Weiss; Paul W. Davis

[57] ABSTRACT

A hybrid multi-frequency synthesizer is comprised of an analog phase lock loop, a digital phase lock loop and a phase lock loop monitor. The digital phase lock loop provides an accelerated, accurate frequency acquisition mode for the synthesizer. The analog phase lock loop provides a robust operating mode after frequency acquisition is achieved. The phase lock loop monitor provides a control circuit that monitors the synthesizer for frequency and phase perturbations. The phase lock loop monitor controls an electronic switch that selects either the analog or digital phase lock loop. The invention is further characterized by programmable band pass filtering, peak sensitivity detection and a fast lock feature.

39 Claims, 4 Drawing Sheets

HYBRID ANALOG-DIGITAL PHASE LOCK LOOP MULTI-FREQUENCY SYNTHESIZER

BACKGROUND OF THE INVENTION

1. Field of the Invention

This invention relates generally to phase lock loops implemented in communication devices and systems. Specifically, this invention relates to a hybrid phase lock loop, which includes a digital component, an analog component and a loop monitor for switching between the digital control loop and the analog control loop.

2. Description of the Prior Art

The current state of modern communication systems describes various forms of phase lock loops (hereinafter "PLL") and voltage controlled oscillators (hereinafter "VCO") to synchronize transceivers with communication frequencies.

Figure 1:
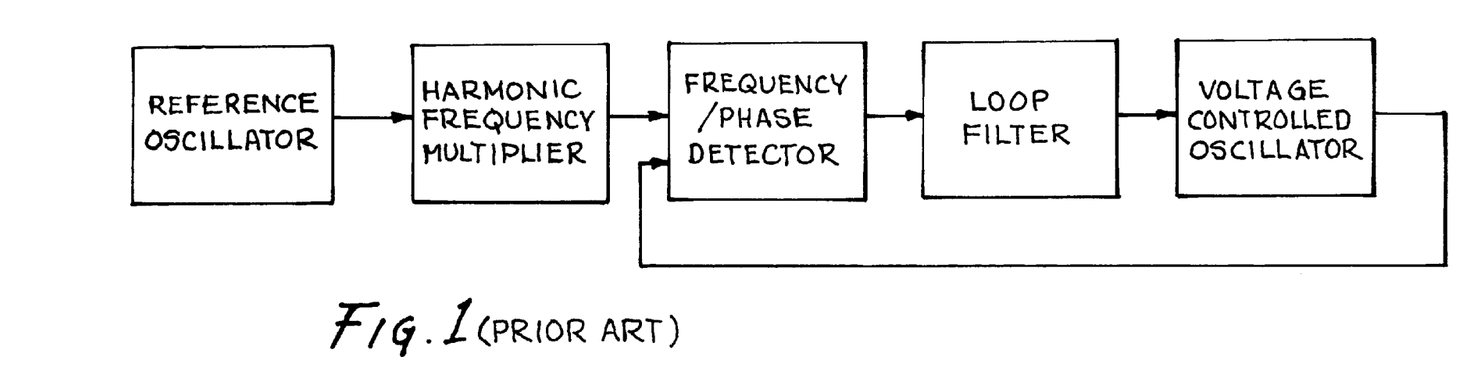
FIG. 1 is a block diagram of an analog phase lock loop.

Referring to FIG. 1, one form of the genus of the PLL is the analog version, which is well known to those skilled in the art of telecommunications and is briefly described below. The analog PLL genus is characterized by a reference oscillator coupled to a harmonic frequency multiplier. The harmonic frequency multiplier, which produces a frequency comb that varies in amplitude over frequency, is coupled to a frequency/phase detector. The output of the frequency/phase detector is coupled to a loop filter, which typically is a low pass filter. The output of the loop filter is coupled to a VCO that produces a feedback signal to the frequency/phase detector. When the VCO output matches the reference oscillator in both frequency and phase, the two signals are essentially canceled by the frequency/phase detector which produces a null or zero output. A mismatch in frequency or phase will produce a signal that is sent to the VCO via the loop filter for synchronizing the PLL.

The advantage of the analog PLL genus is that there is relatively low phase noise produced by the electronic circuit. Low noise is desirable because it minimizes the opportunity for frequency or phase errors. Thus, once the analog PLL locks on to the incoming signal the possibility of the circuit losing the lock is relatively small.

A fundamental disadvantage of the analog PLL is a tendency to arbitrarily lock to any harmonic of the reference frequency that falls within the tuning range of the VCO. In order to force the analog PLL to reliably lock to a particular frequency in spite of the effects of the environment, manufacturing variations and component aging, it is necessary to reduce the tuning ranger of the VCO to cover only the single desired harmonic of the reference frequency. If it is desired that the analog PLL be capable of locking to one of several frequencies, it is necessary to have a separate VCO with a narrow tuning ranger for each frequency. Multiple VCOs will add to the complexity and cost of the design.

Figure 2:
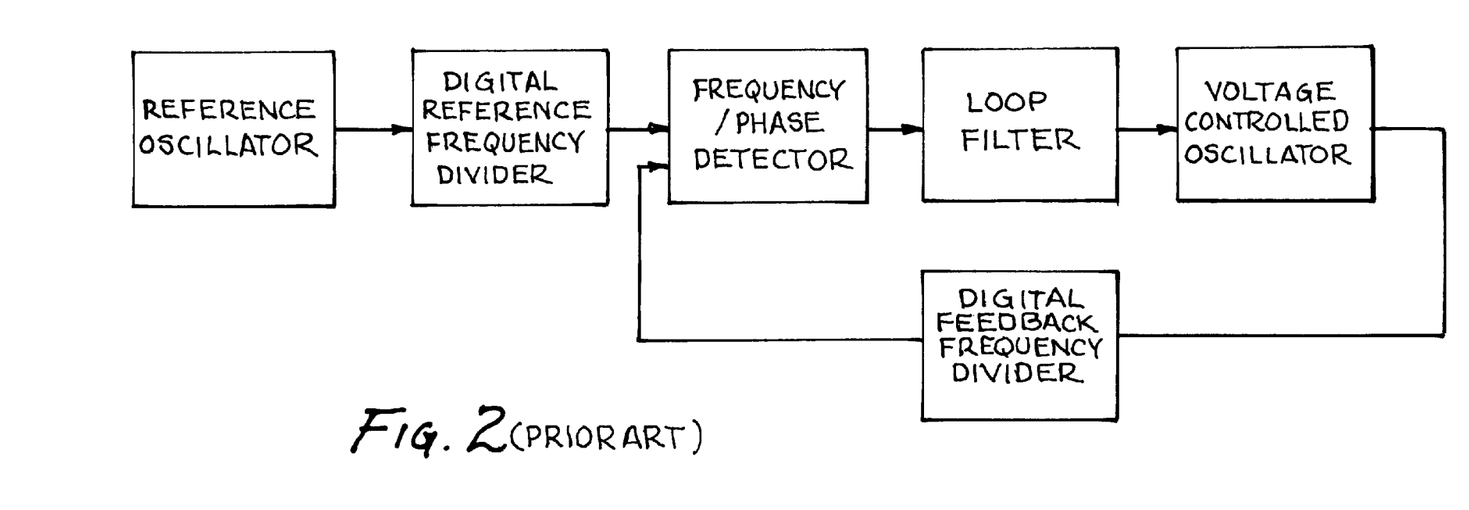
FIG. 2 is a block diagram of a digital phase lock loop.

Referring to FIG. 2, a simple form of the digital PLL genus, which is also known to those skilled in the art, is illustrated. The digital PLL is characterized by a reference oscillator coupled to digital frequency divider. The output of the digital frequency divider is coupled to the frequency/phase detector. The frequency/phase detector is coupled to the low pass filter, whose output is coupled to the VCO. The VCO produces a feedback signal that is coupled to a second digital frequency divider which in turn is coupled to the frequency/phase detector.

The advantage of the digital PLL genus is that the two digital frequency dividers are programmable by an external source for high bandwidth and resolution. Thus, the digital implementation of the PLL provides for excellent control for steering or tuning the frequency synthesizer. Furthermore, the digital control capability affords multi-frequency tuning over a broad band.

A fundamental disadvantage of the digital PLL genus is that excessive noise is intrinsic to the digital nature of the design. Excessive noise results in the decreased performance of the phase lock loop.

The hybrid PLL incorporates features of both the analog and digital PLL. Rudimentary hybrids function by allowing the digital PLL with its superior tuning capability to initiate the frequency sweep and closing the digital loop. Once the digital loop is closed, the digital circuitry then switches control to the analog loop. The digital loop maintains its own phase lock even after switching control to the analog loop. Furthermore, the digital loop will monitor the frequency lock and will resume control and re-initiate the lock sequence if phase or frequency perturbations are sensed.

The detriments of these hybrid circuits are that phase perturbations which are endemic to the digital circuitry, but to which the analog circuitry are relatively immune, will trigger the digital circuitry to reinitiate the lock unnecessarily. These unnecessary and unwanted reinitializations result in catastrophic loss of telecommunications data.

Therefore, a need existed to provide a hybrid analog-digital PLL that is capable of multi-frequency synthesis that will address that problem of premature, unwanted control resumption of and reintialization by the digital PLL once the loop has been switched to the analog circuitry.

SUMMARY OF THE INVENTION

It is an object of the present invention to provide a hybrid analog-digital PLL multi-frequency synthesizer with enhanced digital control.

It is another object of the present invention to provide a hybrid analog-digital PLL multi-frequency synthesizer where the digital loop blocks phase perturbations.

It is another object of the present invention to provide a hybrid analog-digital PLL multi-frequency synthesizer where the digital loop resumes control only when there are frequency errors which exceed a definable and programmable tolerance.

It is another object of the present invention to provide a hybrid analog-digital PLL multi-frequency synthesizer that provides for expedited switching from the digital loop to the analog loop.

It is still another object of the present invention to provide a hybrid analog-digital PLL multi-frequency synthesizer which is capable of controlling the switch to the digital loop based on amplitude sensitivity of a frequency anomalies.

In accordance with one embodiment of the present invention, a multi-frequency synthesizer comprises an analog phase lock loop coupled to a switch; a digital phase lock loop coupled to the switch; a phase lock loop monitor coupled to the switch; a reference oscillator which is coupled to the analog phase lock loop and to the digital phase lock loop; and, the switch for selecting activation as between the analog phase lock loop and the digital phase lock loop.

In accordance with another embodiment of the present invention, a multi-frequency synthesizer comprises an analog phase lock loop coupled to a switch; a digital phase lock loop coupled to the switch; a phase lock loop monitor coupled to the switch wherein the phase lock loop monitor comprises a digital reference frequency divider coupled to the reference oscillator, a diode mixer coupled to the digital reference frequency divider, a band pass filter coupled to the diode mixer, an integrator circuit coupled to the band pass filter circuit, and a comparator coupled to the integrator circuit; a reference oscillator which is coupled to the analog phase lock loop and to the digital phase lock loop; and the switch for selecting activation as between the analog phase lock loop and the digital phase lock loop.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 3:
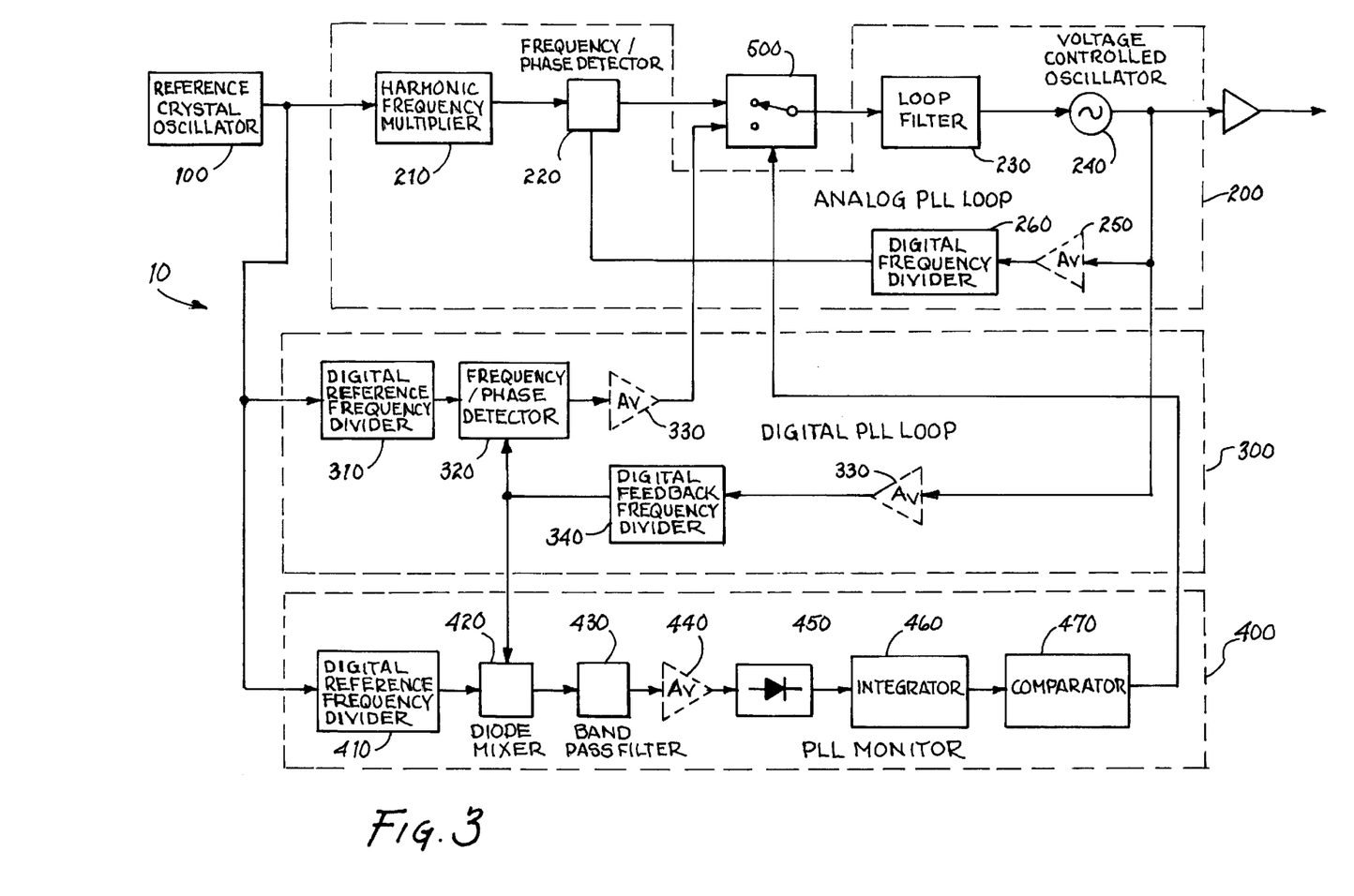
FIG. 3 is a block diagram of the present invention

Referring to FIG. 3, a hybrid analog-digital phase lock loop multi-frequency synthesizer 10 (hereinafter "synthesizer") is shown. A multi-frequency synthesizer 10 comprising a reference oscillator 100 an analog phase lock loop 200, a digital phase lock loop 300, a phase lock loop monitor 400 and a switch 500 for controlling activation as between the analog phase lock loop and the digital phase lock loop.

The reference oscillator 100 provides a predetermined frequency to the analog PLL 200, the digital PLL 300 and the PLL monitor 400.

In the preferred embodiment, the analog PLL 200 is comprised of a harmonic frequency multiplier 210, a frequency phase detector 220 coupled to the harmonic frequency multiplier 210, a loop filter 230 coupled to a switch, a voltage controlled oscillator (VCO) 240 coupled to the loop filter 230, as well as optional amplifiers 250 and digital frequency divider 260 (shown in dashed lines to indicate optional). Note that the output, or feedback signal from the VCO 240, is shared by the analog PLL 200 and the digital PLL 300.

Also in the preferred embodiment, the digital PLL 300 is comprised of digital reference frequency divider 310 coupled to the reference oscillator 100, a second frequency/phase detector 320 coupled to the digital reference frequency divider 310, to the switch 500 and to the PLL monitor 400, a digital feedback frequency divider 340 coupled to the VCO 240 and to the frequency/phase detector 320. Optional amplifiers 330 are also included in the digital PLL 300.

The function and operation of the analog PLL 200 and the digital PLL 300 are well known to those skilled in the art. The advantages and disadvantages of the analog PLL 200 and the digital PLL 300 have been discussed above.

The PLL monitor 400 is the control mechanism for switching the synthesizer 10 as between the digital PLL 300 and the analog PLL 200. The PLL monitor 400 is comprised of a second digital reference frequency divider 410 coupled to the reference oscillator 100, a diode mixer 420 coupled to the digital reference frequency divider 410 and to the digital PLL 300, a band pass filter 430 coupled to the diode mixer 420, optional amplifier 440 coupled to the band pass filter 430, a diode 450 coupled to the amplifier 440, an integrator circuit 460 coupled to the diode 450, and a comparator 470 coupled to the integrator 460 and to the switch 500 selection input.

The switch 500 has two signal inputs and a selection input. One of the signal inputs is coupled to the analog PLL 200 at the point following the frequency/phase detection as between the reference oscillator 100 and the feedback signal from the VCO 240. The other signal input is similarly coupled to the digital PLL 300 at the point following frequency phase detection. The selection input for the switch 500 is coupled to the output of the comparator 470. The output of the switch 500 is coupled to the loop filter 230.

Figures 4, 5:
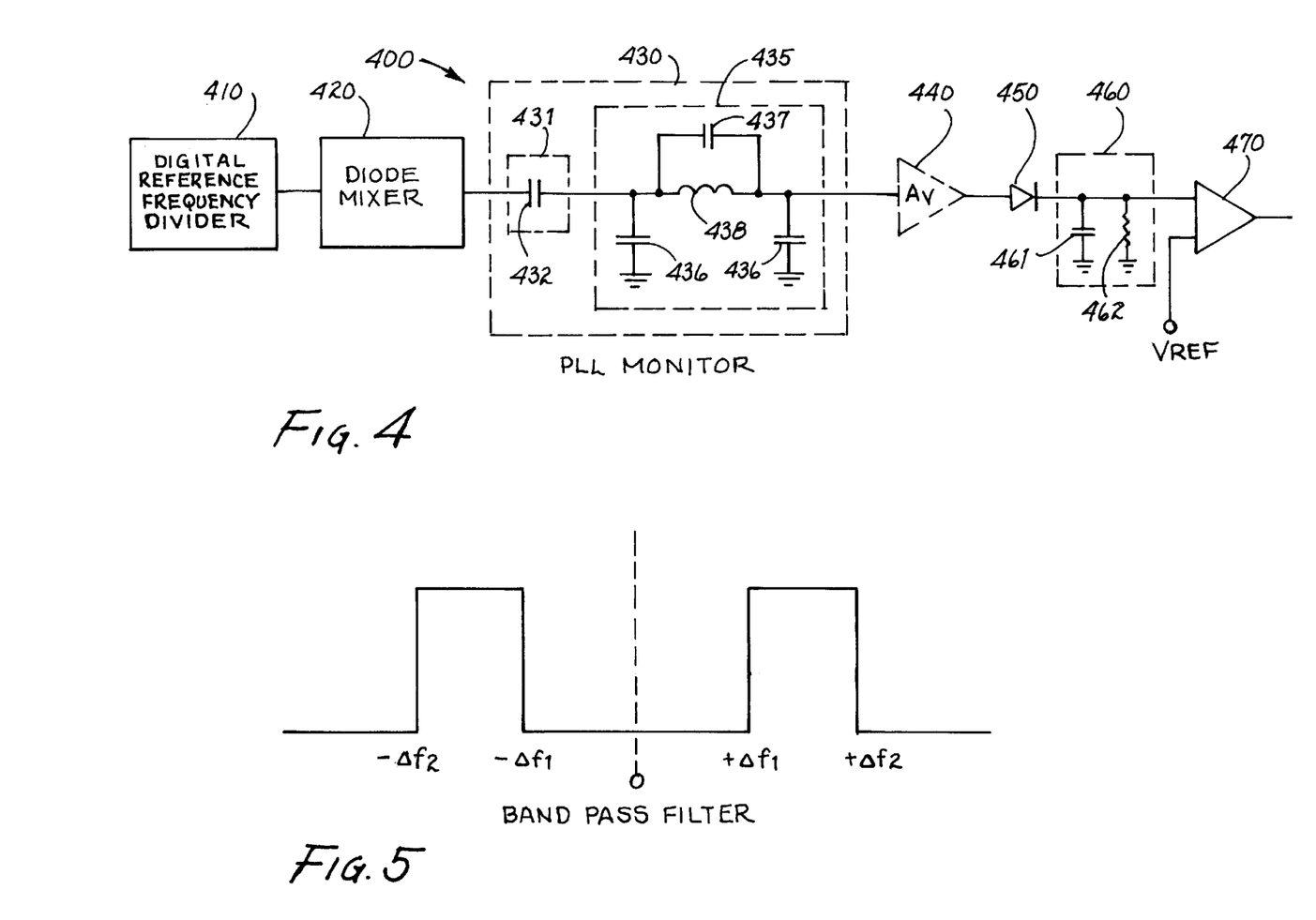
FIG. 4 is a schematic diagram of the phase lock loop monitor of the present invention.
FIG. 5 is a diagram of the fast lock up feature of the present invention.

Referring to FIG. 4, wherein like numerals represent like elements, a detailed diagram of the PLL monitor 400 is presented. The band pass filter 430 is divided into two components: the high pass filter 431, which in the preferred embodiment is a capacitor 432, and a low pass filter 435. In other embodiments, the high pass filter 431 may encompass more sophisticated circuitry. The low pass filter 435 is comprised of a network comprising capacitors 436 & 437 and inductor 438, designed to enhance noise immunity.

The purpose of the high pass filter 431 is to strip the direct current component, i.e. the phase component, from the output of the diode mixer 420. Thus, the output of the high pass filter 431 is the alternating current component, i.e. the frequency component of the diode mixer 420. Note that phase perturbations of significant magnitude, as opposed to phase drift, may cause instantaneous frequency anomalies that may not be blocked by the high pass filter 431. In the illustrated embodiment, the band pass filter is illustrated as comprised of fixed components. However, those skilled in the art will recognize that a variety of optional capacitor and inductor components, controlled by a programmable switching network may be contemplated.

When the frequency component of the reference oscillator 100 matches the frequency component of the VCO 240 feedback signal, then the signals cancel and the AC output of the diode mixer 420 is zero. However, if the frequency component of the reference oscillator 100 is different than the frequency component of the VCO 240 feedback signal, then the AC output of the diode mixer 420 is a sine wave with an amplitude and frequency representative of the difference between the input signals.

Referring to FIG. 5, the band pass filter 430 establishes a high and low band, which is Δfrequencies (+/− Δf$_1$ to +/− Δf$_2$) from desired lock frequency. Sine wave outputs from the diode mixer 420 which fall in the trough close to the desired lock frequency are treated as low level noise for which the analog loop 200 can overcome. The band pass filter 430 will block the transmission of such noise from the remainder of the PLL monitor 400 circuitry. However, if the sine wave outputs from the diode mixer 420 are in the effective filter band, i.e. of enough significance to cause the analog loop 200 to lose lock, then the sine wave is passed on to the remainder of the PLL monitor 400 for processing and possible switching of control back to the digital loop 300.

Referring back to FIG. 4, if the diode mixer generates a sine wave output, which the band pass filter 430 has not filtered, then the sine wave passes though optional amplifier 440 and the rectification diode 450. The integrator, which in the preferred embodiment is an RC time constant circuit, generates a voltage level which is sent to the comparator 470. The comparator will trigger if the signal input, which is the output of the integrator 460, exceeds the reference voltage V$_{REF}$. The output of the comparator 470 is coupled to the selection input of the switch 500. If the comparator 470 fires, the switch will open the analog PLL 200 and close the digital PLL 300.

The digital PLL 300 will then attempt to reinitiate lock by sweeping the frequency spectrum. Once the digital PLL 300 locks on to the correct frequency the output of the diode mixer 420 reverts to zero. Once the integrator 460 discharges the charge previously set by the frequency mismatch, the signal input to the comparator 470 will fall below V$_{REF}$ and the comparator 470 will trip to the opposite state. This will result in the switch 500 closing the analog PLL 200 and opening the digital PLL 300.

Referring once again to FIG. 5, the fast lock feature of the invention is discussed. In the prior art hybrid analog-digital PLL circuits, the circuit would not be able to switch from the digital to the analog until a precise frequency match was attained by the digital loop. This corresponds to the zero position in FIG. 5.

In the present invention, the switch from the digital PLL 300 to the analog PLL 200 will occur once the frequency mismatch is within a predefined and programmable tolerance defined in the figure as +/− Δf$_1$. That is, as the digital PLL 300 is sweeping the frequency band and attempting to acquire lock, the diode mixer 420 is producing a sine wave which maintains the switch 500 in the digital PLL 300 position. At the point where the frequency sweep approaches +/− Δf$_1$, the diode mixer 420 will produce a zero output, which in turn will cause the switch 500 to select the analog PLL 200. Because there is a de minimus frequency differential once within +/− Δf$_1$, the analog loop is capable of completing the frequency steering to the precise frequency and a fast, also called an early, lock is attained as compared to the prior art.

Referring to FIGS. 4, 5, 6 and 7 the peak sensitivity feature of the invention is shown for a change to a new frequency. At a frequency change, the diode mixer 420 begins to generate an output as a result of the frequency differential (FIG. 4). At point Δf$_2$ in FIG. 5 (from either the positive or negative direction) and after passing through the band pass filter 430 and the rectification diode 450, the capacitor 462 begins to charge.

Figure 6:
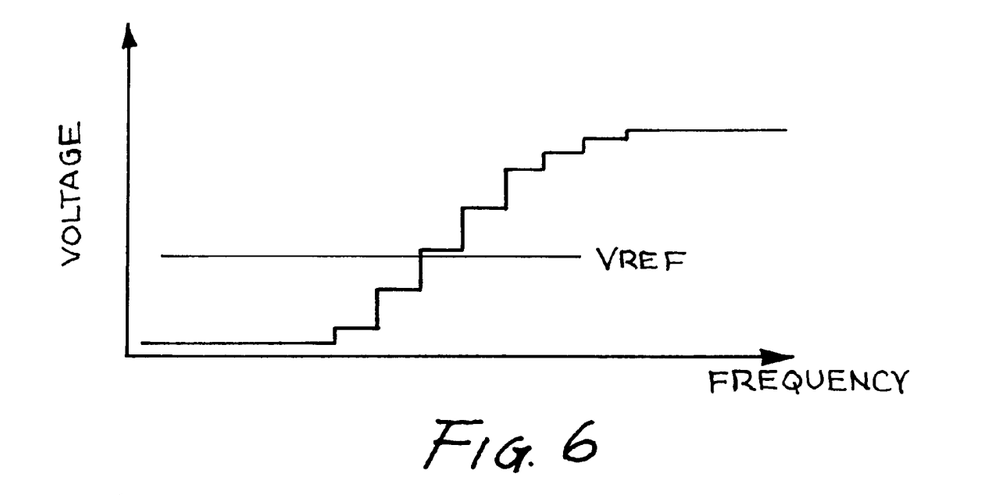
FIG. 6 is a diagram of the charging phase of the peak sensitivity detection feature of the present invention.

FIG. 6 shows the charging process of the capacitor 461 to a peak voltage on an expanded time scale. Once the capacitor 461 voltage rises above the reference voltage, V$_{REF}$, the comparator switches states. This causes the synthesizer 10 to switch from the analog PLL 200 to the digital PLL 300 for frequency acquisition. The integrator 460 and comparator 470 combination inhibits switching to the frequency acquisition mode if the peak sensitivity does not exceed that of V$_{REF}$.

Figure 7:
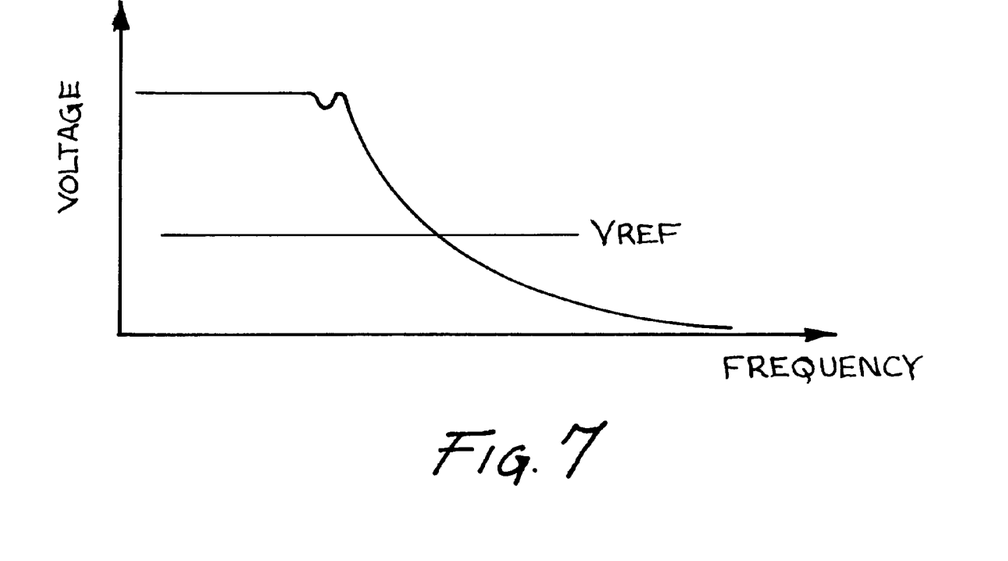
FIG. 7 is a diagram of the discharging phase of the peak sensitivity detection feature of the present invention.

During the acquisition mode, the digital PLL 300 corrects the tuning voltage of the VCO 240 until the differential frequency approaches zero. At the point Δf$_1$ in FIG. 5, the band pass filter 430 blocks the signal to the integrator 460. The capacitor 461 begins to discharge as shown in FIG. 7 in accordance with a time value constant set by the characteristics of the capacitor 461 and the resistor 462. When the output of the capacitor 461 drops below that of V$_{REF}$, the comparator changes state and the synthesizer 10 switches to the analog PLL 200 via the switch 500.

Although the invention has been particularly shown and described with reference to a preferred embodiment thereof, it will be understood by those skilled in the art that changes in form and detail may be made therein without departing from the spirit and scope of the invention.

What is claimed is:

1. A multi-frequency synthesizer comprising:
   an analog phase lock loop coupled between an input terminal and an output terminal, the analog phase lock loop circuit including a switch;
   a digital phase lock loop coupled to the input terminal, to the output terminal and to the switch;
   a phase lock loop monitor coupled to the input terminal for providing a control signal to the switch in response to an output signal from the output terminal;
   a reference oscillator coupled to the input terminal for providing a reference signal at a predetermined frequency; and
   wherein the switch is switched between the analog phase lock loop and the digital phase lock loop for providing the output signal.

2. The synthesizer in accordance with claim 1 wherein the analog phase lock loop comprises:
   a harmonic frequency multiplier coupled to the reference oscillator;
   a frequency/phase detector coupled to the harmonic frequency multiplier;
   a loop filter coupled to the frequency/phase detector through the switch; and
   a voltage controlled oscillator coupled to the loop filter and the frequency/phase detector.

3. The synthesizer in accordance with claim 2 wherein the digital phase lock loop comprises:
   a digital reference frequency divider coupled to the reference oscillator;
   a second frequency/phase detector coupled to the digital reference frequency divider; and a digital feedback frequency divider coupled to the voltage controlled oscillator.

4. The synthesizer in accordance with claim 3 wherein the phase lock loop monitor comprises:
   a second digital reference frequency divider coupled to the reference oscillator;
   a diode mixer coupled to the second digital reference frequency divider;
   a band pass filter coupled to the diode mixer;
   an integrator circuit coupled to the band pass filter circuit; and
   a comparator coupled to the integrator circuit.

5. The synthesizer in accordance with claim 4 wherein the band pass filter comprises:
   a high pass filter; and
   a low pass filter coupled to the high pass filter.

6. The synthesizer in accordance with claim 5 wherein the high pass filter is comprised of a capacitor.

7. The synthesizer in accordance with claim 5 wherein the high pass filter blocks a direct current component of an output of the diode mixer.

8. The synthesizer in accordance with claim 5 wherein the low pass filter comprises:
   at least one capacitor; and
   at least one inductor coupled to the at least one capacitor.

9. The synthesizer in accordance with claim 5 wherein the low pass filter provides noise immunity protection for the synthesizer.

10. The synthesizer in accordance with claim 4 wherein the integrator is comprises:
    at least one resistor; and
    at least one capacitor coupled to the at least one resistor.

11. The synthesizer in accordance with claim 4 wherein the integrator is a resistor-capacitor network for providing a time value constant to the comparator.

12. The synthesizer in accordance with claim 4 wherein:
    a first input of the comparator is coupled to an output of the integrator;
    a second input of the comparator is coupled to a reference voltage; and
    an output of the comparator is coupled to the switch.

13. The synthesizer in accordance with claim 1 wherein the digital phase lock loop provides for an initial lock for the synthesizer.

14. The synthesizer in accordance with claim 13 wherein after the initial lock is established by the digital phase lock loop the phase lock loop monitor switches from the digital phase lock loop to the analog phase lock loop.

15. The synthesizer in accordance with claim 14 wherein the phase lock loop monitor switches from the analog phase lock loop to the digital phase lock loop in response to frequency and phase perturbations.

16. The synthesizer in accordance with claim 1 wherein the phase lock loop monitor provides a fast lock capability for the synthesizer.

17. The synthesizer in accordance with claim 5 wherein the band pass filter provides for a frequency spectrum which filters frequency and phase perturbations.

18. The synthesizer in accordance with claim 12 wherein the band pass filter is programmable to provide for a variable frequency spectrum which filters frequency and phase perturbations.

19. The synthesizer in accordance with claim 5 wherein the band pass filter provides for a frequency spectrum that permits passage of frequency and phase perturbations.

20. The synthesizer in accordance with claim 19 wherein the band pass filter is programmable to provide for a variable frequency spectrum that permits passage of frequency and phase perturbations.

21. A multi-frequency synthesizer comprising:
    an analog phase lock loop coupled between an input terminal and an output terminal, the analog phase lock loop circuit including a switch;
    a digital phase lock loop coupled to the input terminal, to the output terminal and to the switch;
    a phase lock loop monitor coupled to the input terminal for providing a control signal to the switch in response to an output signal from the output terminal, wherein the phase lock loop monitor comprises:
       a digital reference frequency divider coupled to the reference oscillator;
       a diode mixer coupled to the digital reference frequency divider;
       a band pass filter coupled to the diode mixer;
       an integrator circuit coupled to the band pass filter circuit; and
       a comparator coupled to the integrator circuit;
    a reference oscillator coupled to the input terminal for providing a reference signal at a predetermined frequency; and
    wherein the switch is switched between the analog phase lock loop and the digital phase lock loop for providing the output signal.

22. The synthesizer in accordance with claim 21 wherein the analog phase lock loop comprises:
    a harmonic frequency multiplier coupled to the reference oscillator;
    a frequency/phase detector coupled to the harmonic frequency multiplier;
    a loop filter coupled to the frequency/phase detector through the switch; and
    a voltage controlled oscillator coupled to the loop filter and the frequency/phase detector.

23. The synthesizer in accordance with claim 22 wherein the digital phase lock loop comprises:
    a second digital reference frequency divider coupled to the reference oscillator;
    a second frequency/phase detector coupled to the second digital reference frequency divider; and
    a digital feedback frequency divider coupled to the voltage controlled oscillator.

24. The synthesizer in accordance with claim 21 wherein the band pass filter comprises:
    a high pass filter; and
    a low pass filter coupled to the high pass filter.

25. The synthesizer in accordance with claim 24 wherein the high pass filter is comprised of a capacitor.

26. The synthesizer in accordance with claim 24 wherein the high pass filter blocks a direct current component of the output of the diode mixer.

27. The synthesizer in accordance with claim 24 wherein the low pass filter comprises:
    at least one capacitor; and
    at least one inductor coupled to the at least one capacitor.

28. The synthesizer in accordance with claim 24 wherein the low pass filter provides noise immunity protection for the synthesizer.

29. The synthesizer in accordance with claim 21 wherein the integrator is comprises:
   at least one resistor; and
   at least one capacitor coupled to the at least one resistor.

30. The synthesizer in accordance with claim 21 wherein the integrator is a resistor-capacitor network for providing a time value constant to the comparator.

31. The synthesizer in accordance with claim 21 wherein:
   a first input of the comparator is coupled to an output of the integrator;
   a second input of the comparator is coupled to a reference voltage; and
   an output of the comparator is coupled to the switch.

32. The synthesizer in accordance with claim 21 wherein the digital phase lock loop provides an initial lock for the synthesizer.

33. The synthesizer in accordance with claim 32 wherein after the initial lock is established by the digital phase lock loop the phase lock loop monitor switches from the digital phase lock loop to the analog phase lock loop.

34. The synthesizer in accordance with claim 21 wherein the phase lock loop monitor switches from the analog phase lock loop to the digital phase lock loop in response to frequency and phase perturbations.

35. The synthesizer in accordance with claim 21 wherein the phase lock loop monitor provides a fast lock capability for the synthesizer.

36. The synthesizer in accordance with claim 21 wherein the band pass filter provides for a frequency spectrum which filters frequency and phase perturbations.

37. The synthesizer in accordance with claim 21 wherein the band pass filter is programmable to provide for a variable frequency spectrum which filters frequency and phase perturbations.

38. The synthesizer in accordance with claim 21 wherein the band pass filter provides for a frequency spectrum that permits passage of frequency and phase perturbations.

39. The synthesizer in accordance with claim 21 wherein the band pass filter is programmable to provide for a variable frequency spectrum that permits passage of frequency and phase perturbations.

* * * * *

UNITED STATES PATENT AND TRADEMARK OFFICE
CERTIFICATE OF CORRECTION

PATENT NO  : 6,028,460
DATED      : February 22, 2000
INVENTOR(S): McCollum et al.

It is certified that error appears in the above-identified patent and that said Letters Patent is hereby corrected as shown below:

On the title page, item [73] Assignee:
    Address:  Change Ark. to Ariz.

Signed and Sealed this

Twenty-first Day of November, 2000

Attest:

Q. TODD DICKINSON

*Attesting Officer*            *Director of Patents and Trademarks*